United States Patent [19]
Kasai

[11] Patent Number: 5,654,236
[45] Date of Patent: Aug. 5, 1997

[54] METHOD FOR MANUFACTURING CONTACT STRUCTURE CAPABLE OF AVOIDING SHORT-CIRCUIT

[75] Inventor: Naoki Kasai, Tokyo, Japan

[73] Assignee: NEC Corporation, Tokyo, Japan

[21] Appl. No.: 558,090

[22] Filed: Nov. 13, 1995

[30] Foreign Application Priority Data

Nov. 15, 1994 [JP] Japan .................. 6-280399

[51] Int. Cl.⁶ .................. H01L 21/44; H01L 21/48
[52] U.S. Cl. .................. 438/639; 438/672; 438/702; 438/396; 438/696
[58] Field of Search .................. 437/186, 192, 437/41 SW, 40 SW, 195, 190

[56] References Cited

U.S. PATENT DOCUMENTS

| | | | |
|---|---|---|---|
| 4,313,256 | 2/1982 | Widmann | 437/41 SW |
| 4,378,627 | 4/1983 | Jambotkar | 437/40 SW |
| 4,786,609 | 11/1988 | Chen | 437/41 SW |
| 5,053,349 | 10/1991 | Matsuoka | 437/40 SW |
| 5,066,604 | 11/1991 | Chung | 437/186 |
| 5,071,780 | 12/1991 | Tsai | 437/41 SW |
| 5,330,924 | 7/1994 | Huang et al. | 437/186 |
| 5,434,103 | 7/1995 | Dennison et al. | 437/186 |
| 5,464,793 | 11/1995 | Roehl | 437/186 |
| 5,516,726 | 5/1996 | Kim et al. | 437/192 |
| 5,525,552 | 6/1996 | Huang | 437/41 SW |

FOREIGN PATENT DOCUMENTS

| | | | |
|---|---|---|---|
| 0000180 | 1/1983 | Japan | 437/40 SW |
| 2-111031 | 4/1990 | Japan | 437/40 SW |
| 3-106027 | 5/1991 | Japan . | |
| 4-359521 | 12/1992 | Japan | 437/40 SW |

OTHER PUBLICATIONS

By M. Fukumoto et al., "Double Self–Aligned Contact Technology for Shielded Bit Line Type Stacked Capacitor Cell of 16 MDRAM", *IEICE Transactions*, vol. E 74, No. 4, pp. 818–826, Apr. 1991.

By T. Fukase et al., "A Margin–Free Contact Process Using an $Al_2O_3$ Etch–Stop Layer for High Density Devices", *IEDM Tech. Dig.*, pp. 837–840, 1992.

*Primary Examiner*—Charles L. Bowers, Jr.
*Assistant Examiner*—Lynne A. Gurley
*Attorney, Agent, or Firm*—Young & Thompson

[57] ABSTRACT

In a method for manufacturing a contact structure, a first insulating layer, a first conductive layer and a silicon nitride layer are sequentially formed on a semiconductor substrate. The silicon nitride layer and the first conductive layer are anistropically etched with a first pattern mask. A sidewall of the first conductive layer is oxidized. A second insulating layer is formed on the entire surface, and a contact hole is perforated in the first and second insulating layers. Finally, a second conductive layer is buried in the contact hole.

5 Claims, 18 Drawing Sheets

METHOD FOR MANUFACTURING CONTACT STRUCTURE CAPABLE OF AVOIDING SHORT-CIRCUIT

BACKGROUND OF THE INVENTION

1. Field of the Invention

The present invention relates to a method for manfacturing a semiconductor device, and more particularly, to a method for manfacturing a contact structure.

2. Description of the Related Art

As semiconductor devices bye been become more finely structured, connection layers (or wiring layers) have also become finer. Simultaneously, a contact structure for connecting a connection layer to another connection layer or to a semiconductor substrate has also become finer.

In a first prior art method for manufacturing a contact structure (see: M. Fukumoto et al., "Double Self-aligned Contact Technology for Shielded Bit line Type Stacked Capacitor Cell of 16 MDRAM", IEICE Transactions, Vol, E74, No. 4, pp. 818–826, April 1991), a first connection layer is formed on a first insulating layer formed on a semiconductor substrate. Then, a second insulating layer is formed on the first connection layer, and a contact hole is perforated in the first and second insulating layers. Then, a sidewall insulating layer is formed on sidewalls within the contact hole. Finally, a second connection layer is buried in the contact hole. Thus, the first connection layer is electrically isolated from the second connection layer by the second insulating layer and the sidewall insulating layer. This will be explained later in detail.

In the first prior art method, however, when the pitch of the first connection layer becomes small, the first connection layer may be exposed, since the sidewall insulating layer on the top of the first connection layer is etched. As a result, the first connection layer is short-circuited to the second connection layer.

In a second prior art method for manufacturing a contact structure (see: T. Fukasa et al., "A Margin-Free Contact Process Using An $Al_2O_3$ Etch-Stop Layer For High Density Devices", IEDM Tech. Dig., pp. 837–840, 1992), a first connection layer and an $Al_2O_3$ cap layer are formed on a first insulating layer formed on a semiconductor substrate. Then, the $Al_2O_3$ cap layer and the first connection layer are sequentially patterned, so that the $Al_2O_3$ cap layer is formed on only the top of the first connection layer. Further, an $Al_2O_3$ layer is formed on the entire surface, and is etched back so that the $Al_2O_3$ layer is left on sidewalls of the first connection layer. Then, a second insulating layer is formed, and a contact hole is perforated in the first and second insulating layers. Finally, a second connection layer is buried in the contact hole. Thus, when the $Al_2O_3$ layer is left on the sidewalls of the first connection layer by back etching, the first connection layer is hardly exposed, since the $Al_2O_3$ cap layer and the $Al_2O_3$ layer cover the top of the first connection layer. This will be explained later in detail.

In the second prior art method, however, the second insulating layer is made of boron glass including silicon oxide or boron-including phospho-silicated glass (BPSG). As a result, when a heating operation is carried out to reflow the second insulating layer, the $Al_2O_3$ cap layer and the $Al_2O_3$ layer thermally react with the silicon component or refractory metal component of the first connection layer, to create an aluminum silicon compound or the like. This may cause a short-circuit between the first and second connection layers. Also, the first connection layer is deteriorated.

In a third prior art method for manufacturing a contact structure (see: JP-A-3-106027), a first connection layer is formed on a first insulating layer formed on a semiconductor substrate. Then, a silicon oxide layer and an $AlN_x$ stopper are sequentially formed on the first connection layer. Then, the $AlN_x$ stopper layer, the silicon oxide layer and the first connection layer are patterned. In this case, the first connection layer is overetched. Then, a second insulating layer is formed, and a contact hole is perforated in the first and second insulating layers. In this case, the second insulating layer is left on sidewalls of the first connection layer. Finally, a second connection layer is buried in the contact hole. This will be explained later in detail.

In the above-described third prior art method, however, the silicon oxide layer is indispensible between the $AlN_x$ stopper and the first connection layer, in order to avoid thermal reaction therebetween. As a result, the contact hole is deeper by the height of the silicon oxide layer, which may cause a contact defect. Also, the first connection layer, particularly, an upper portion thereof is overetched, so that the $AlN_x$ stopper and the silicon oxide layer are unstable with the first connection layer. At worst, the $AlN_x$ stopper and the silicon oxide layer are separated from the first connection layer, which also invites a short-circuit between the first and second connection layers.

SUMMARY OF THE INVENTION

It is an object of the present invention to provide a method for manufacturing a contact structure which can avoid short-circuit between two connection layers.

Another object is to suppress the reduction of resistance of a lower one of the connection layers.

It is a further object of the present invention to avoid a contact defect of the contact structure.

According to the present invention, in a method for manufacturing a contact structure, a first insulating layer, a first conductive layer and a silicon nitride layer are sequentially formed on a semiconductor substrate. The silicon nitride layer and the first conductive layer are anistropically etched with a first pattern mask. A sidewall of the first conductive layer is oxidized. A second insulating layer is formed on the entire surface, and a contact hole is perforated in the first and second insulating layers. Finally, a second conductive layer is buried in the contact hole.

Also, an oxidized portion of the first conductive layer can be removed.

Further, instead of oxidizing the first conductive layer, the first conductive layer is isotropically etched with a mask of the silicon nitride layer.

Thus, the first conductive layer is covered by the silicon nitride layer which does not thermally react with the other layers. That is, the silicon nitride layer does not react with the first conductive layer thermally. Therefore, a short-circuit hardly occurs between the first and second conductive layers. Further, since the width of the first conductive layer can be uniform, the reduction of the resistance value thereof can be suppressed.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of the preferred embodiments, prior art methods for manufacturing a contact structure will be explained with reference to FIGS. 1A through 1E, 2A through 2E, 3A through 3F, 4, and 5A through 5F.

FIGS. 1A through 1E are cross-sectional views illustrating s first prior art method for manufacturing a contact structure (see: M. Fukumoto et al., "Double Self-aligned Contact Technology for Shielded Bit Line Type Stacked Capacitor Cell of 16 MDRAM", IEICE Transactions, Vol. E74, No. 4, pp. 818–826, April 1991).

Figure 1A:
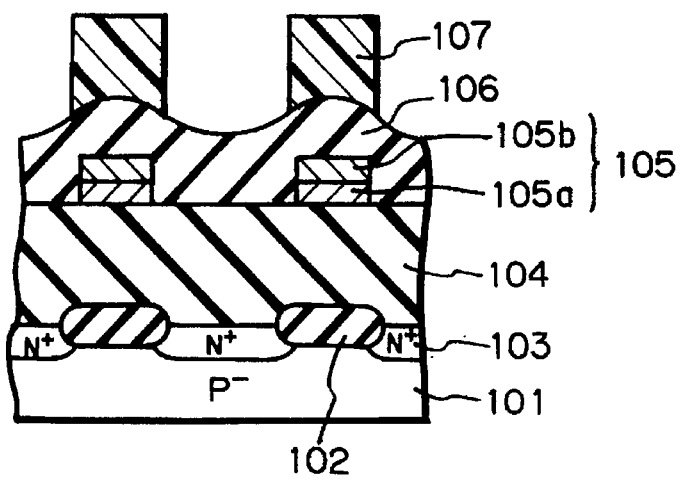
FIGS. 1A through 1E are cross-sectional views illustrating a first prior art method for manufacturing a contact structure.

First, referring to FIG. 1A, a field silicon oxide layer 102 is formed by thermally oxidizing a P-type monocrystalline silicon substrate 101 using a local oxidation of silicon (LOCOS) process. Then, N-type impurity ions such as phosphorous ions or arsenic ions are implanted into the silicon substrate 101 with a mask of the field silicon oxide layer 102, to form N-type impurity diffusion regions 103. Then, an insulating layer 104 is deposited on the entire surface by a chemical vapor deposition (CVD) process. Then, a polycrystalline silicon layer 105a and a tungsten silicide layer 105b are sequentially deposited by CVD processes, and are patterned to form a connection layer 105. Note that the tungsten silicide layer 105b reduces the resistance of the connection layer 105. Then, an insulating layer 106 is deposited on the entire surface by a CVD process. Then, a photoresist pattern 107 is formed.

Figure 1B:
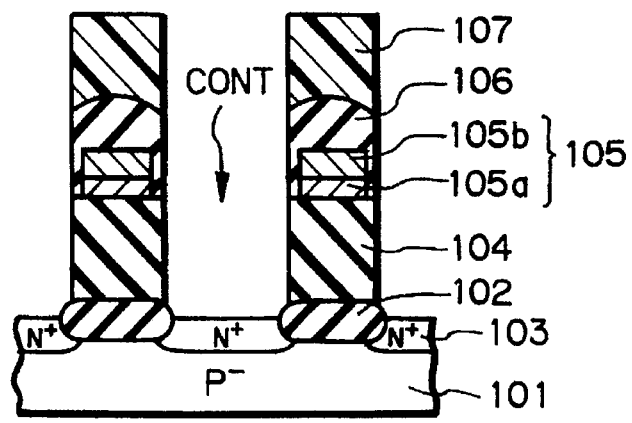

Next, referring to FIG. 1B, a contact hole CONT is perforated in the insulating layers 104 and 106 with a mask of the photoresist pattern 107. Then, the photoresist pattern 107 is removed.

Figure 1C:
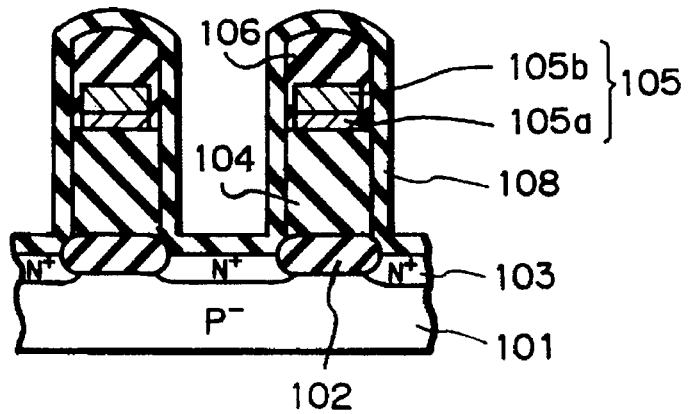

Next, referring to FIG. 1C, a silicon oxide layer 108 is deposited by a high temperature CVD process.

Figure 1D:
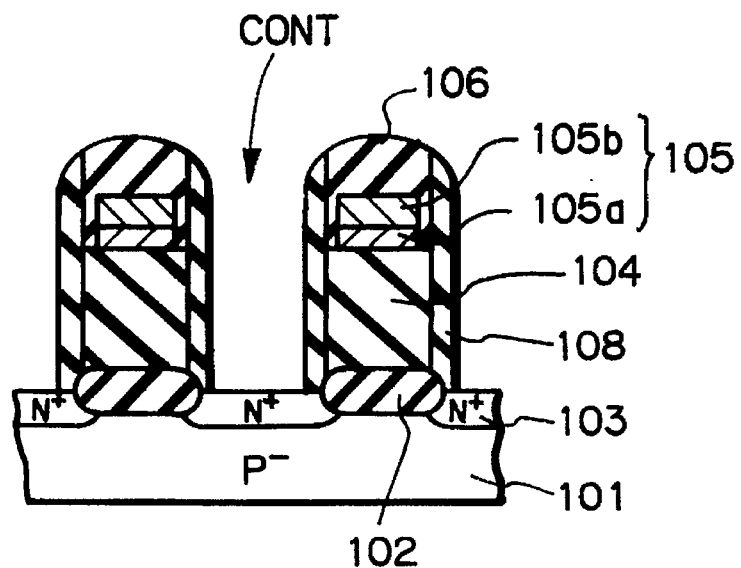

Next, referring to FIG. 1D, the silicon oxide layer 108 is etched back, so that the silicon oxide layer 108 is left on sidewalls of the insulating layers 104 and 106. Thus, even if the photoresist pattern 107 is shifted from an optimum location, so that the connection layer 105 is exposed from the insulating layer 106, the connection 105 is covered by the silicon oxide layer 108.

Figure 1E:
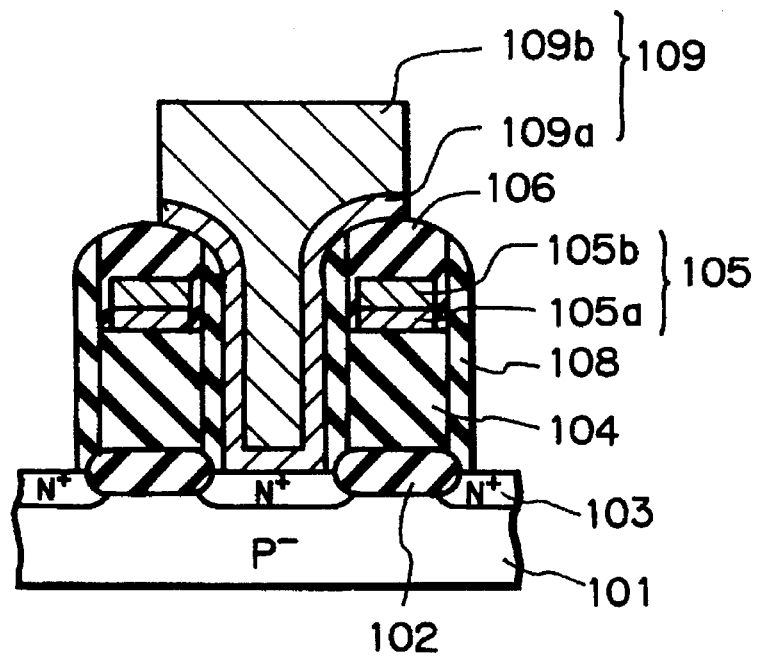

Finally, referring to FIG. 1E, a contact barrier layer 109a and an aluminum alloy layer 109b are deposited and are patterned to form another connection layer 109.

The above-described first prior art method can be applied to a 16 Mbit dynamic random access memory (DRAM) where a 0.5 μm rule is applied. However, it is difficult to apply the first prior art method to a 64 Mbit DRAM or a 256 Mbit DRAM where a 0.3 μm rule or a smaller rule is applied, since the connection layer 105 is short-circuited to the connection layer 109.

Figure 2A:
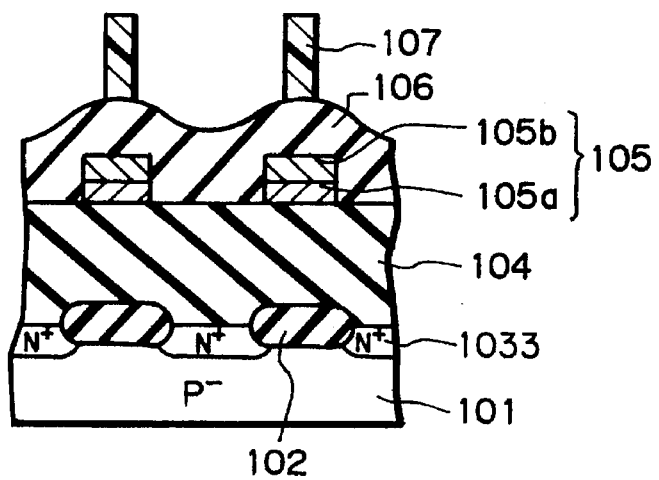
FIGS. 2A through 2E are cross-sectional views illustrating modifications of FIGS. 1A through 1E, respectively.
Figure 2B:
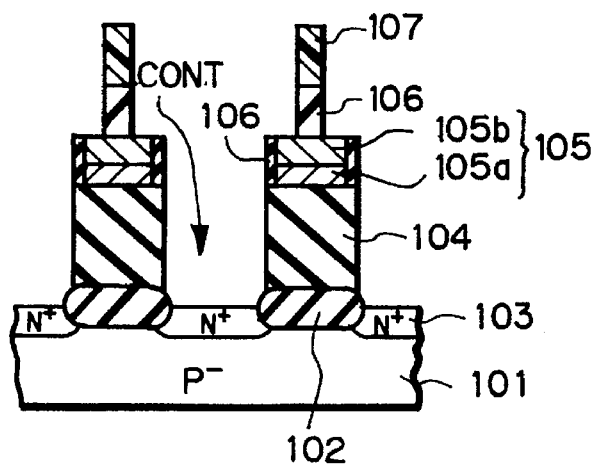
Figure 2C:
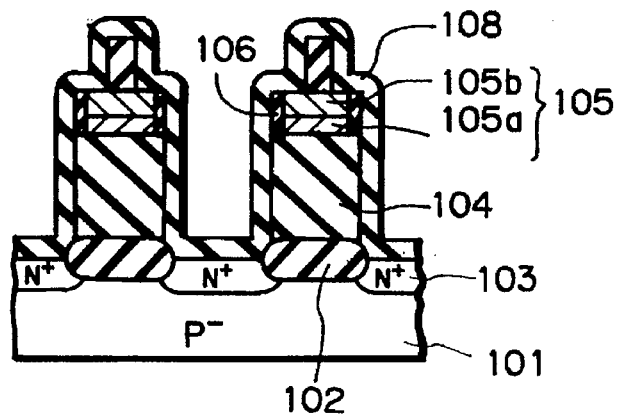
Figure 2D:
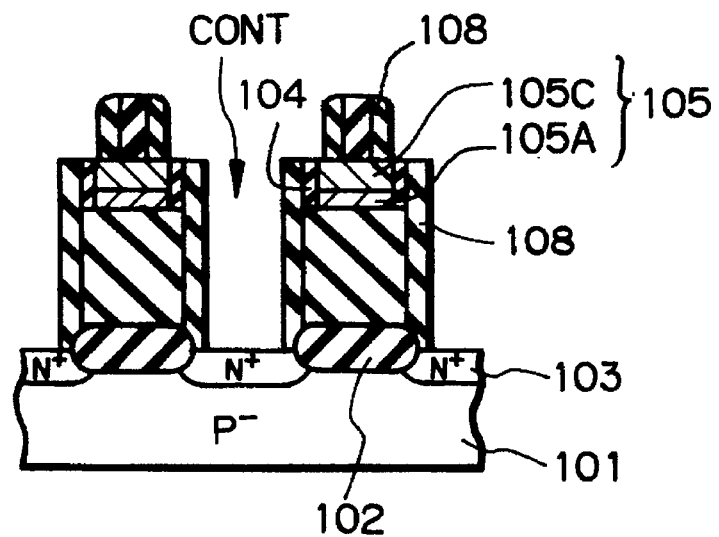
Figure 2E:
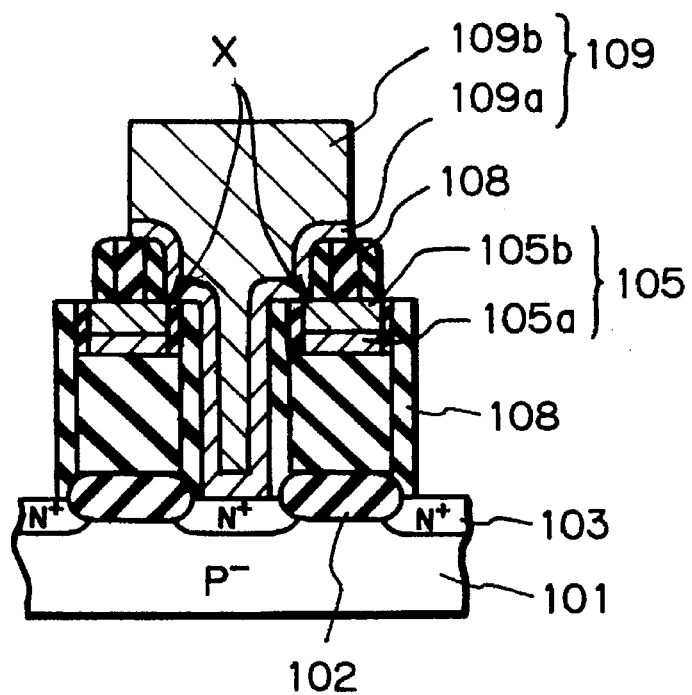

That is, in a 64 Mbit DRAM or a 256 Mbit DRAM, as illustrated in FIGS. 2A through 2E which correspond to FIGS. 1A through 1E, the pitch of the connection layer 105 is small, and therefore, the width of the photoresist pattern 107 is smaller than that of the connection layer 105. As a result, as illustrated in FIG. 2D, when the silicon oxide layer 108 is etched back, the connection layer 105 is exposed. Thus, the connection layer 105 is short-circuited to the connection layer 109 as indicated by X in FIG. 2E.

FIGS. 3A through 3E are cross-sectional views illustrating a second prior art method for manufacturing a contact structure (see: T. Fukase et al., "A Margin-Free Contact Process Using An $Al_2O_3$ Etch-Stop Layer For High Density Devices", IEDM Tech. Dig. pp. 837–840, 1992).

Figure 3A:
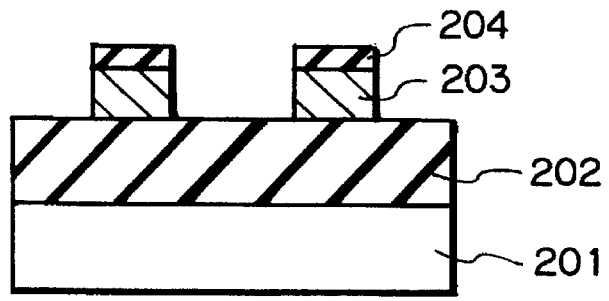
FIGS. 3A through 3F are cross-sectional views illustrating a second prior art method for manufacturing a contact structure.

First, referring to FIG. 3A, an insulating layer 202 is formed on a semiconductor substrate 201. A connection layer 203 and an $Al_2O_3$ cap layer 204 are sequentially deposited and are patterned.

Figure 3B:
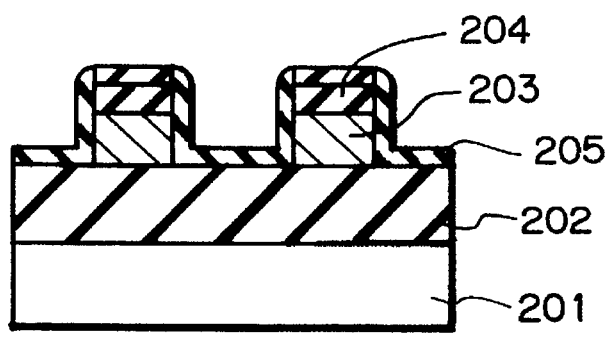

Next, referring to FIG. 3B, an $Al_2O_3$ layer 205 is deposited on the entire surface.

Figure 3C:
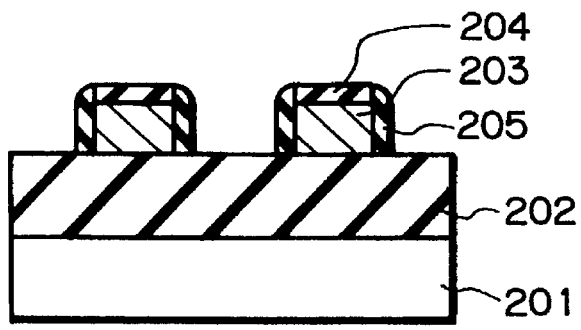

Next, referring to FIG. 3C, the $Al_2O_3$ layer 205 is etched back, so that the $Al_2O_3$ layer 205 is left on sidewalls of the connection layer 203 and the $Al_2O_3$ cap layer 204.

Figure 3D:
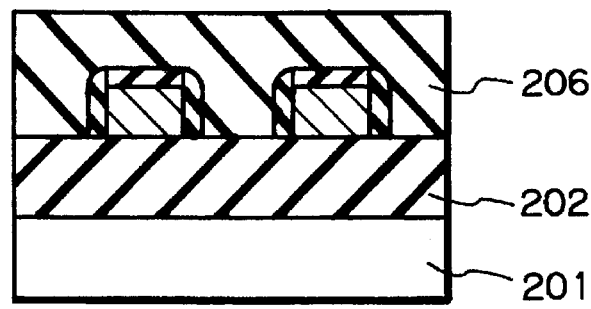

Next, referring to FIG. 3D, an insulating layer 206 is deposited by a CVD process. Then, a reflowing operation is performed upon the insulating layer 206.

Figure 3E:
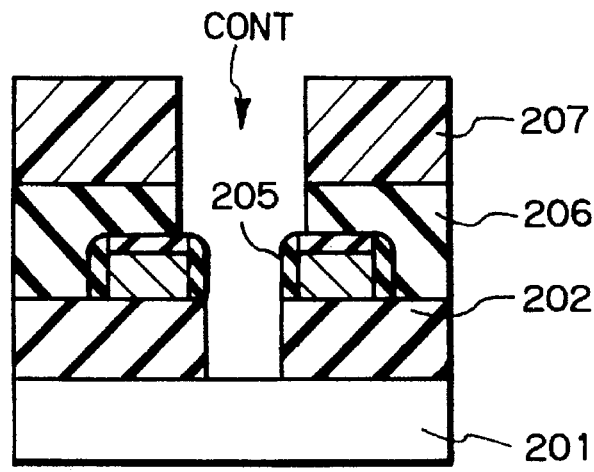

Next, referring to FIG. 3E, a photoresist pattern 207 is formed. Then, the insulating layer 206 is etched with a mask of the photoresist pattern 207, to perforate a contact hole CONT in the insulating layers 202 and 206. Then, the photoresist pattern 207 is removed.

In FIG. 3E, the contact hole CONT is formed in self-alignment with the $Al_2O_3$ cap layer 204 and the $Al_2O_3$ layer 205, even if the photoresist pattern 207 is shifted slightly from an optimum location.

Figure 3F:
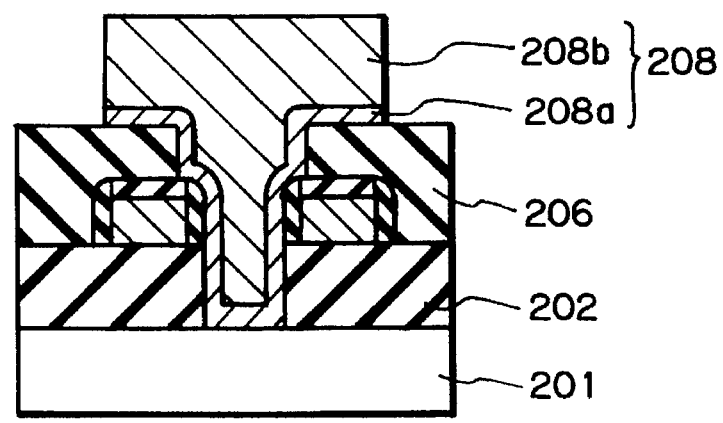
Figure 4:
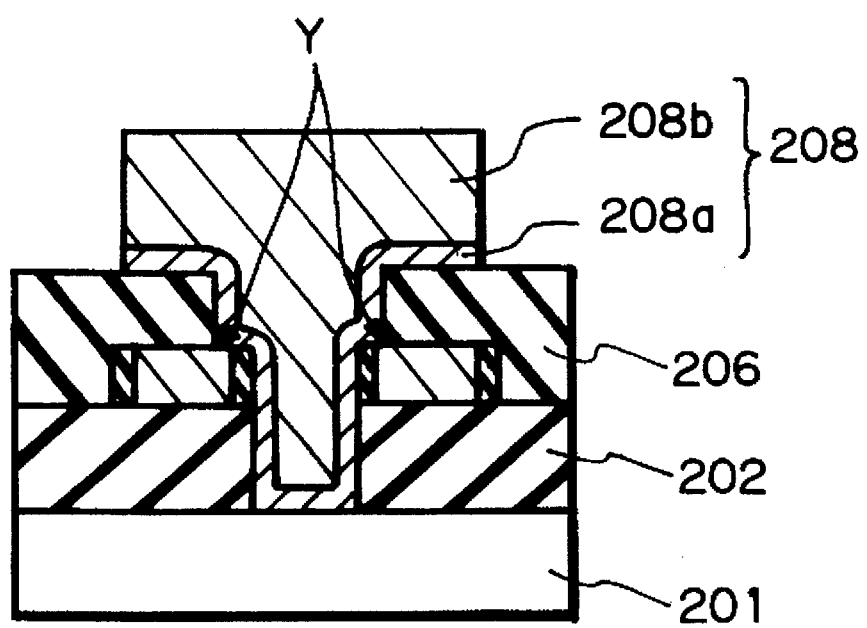
FIG. 4 is a cross-sectional view illustrating a modification of FIG. 3F.

Finally, referring to FIG. 3F, a contact barrier layer 208a and an aluminum alloy layer 208b are deposited and are patterned to form another connection layer 208.

In the above-described second prior art method, even when the $Al_2O_3$ layer 205 is overetched, the $Al_2O_3$ cap layer 204 is left, so that the connection layer 203 is hardly short-circuited to the connection layer 208. Even in this case, when the $Al_2O_3$ layer 205 is greatly overetched, the $Al_2O_3$ cap layer 204 is also etched, so that the connection layer 203 is short-circuited to the connection layer 208 as indicated by Y in FIG. 4.

Also, in the second prior art method, the insulating layer 206 is usually made of boron glass including silicon oxide or BPSG. Therefore, a reflowing operation is performed upon the insulating layer 206 as illustrated in FIG. 3D. Therefore, if the connection layer 203 is made of polycrystalline silicon, the $Al_2O_3$ cap layer 204 and the $Al_2O_3$ layer 205 thermally react with the silicon component of the insulating layer 203, to thereby create an aluminum silicon compound. This aluminum silicon compound is conductive, which may cause a short-circuit between the connection layers 203 and 209. Further the resistance of the connection layer 203 becomes high. Similarly if the connection layer 203 is made of refractory metal, the connection layer 203 thermally reacts with the $Al_2O_3$ layers 204 and 205 during a reflowing process, so that the property of the connection layer 203 is changed.

FIGS. 5A through 5E are cross-sectional views illustrating a third prior art method for manufacturing a contact structure.

Figure 5A:
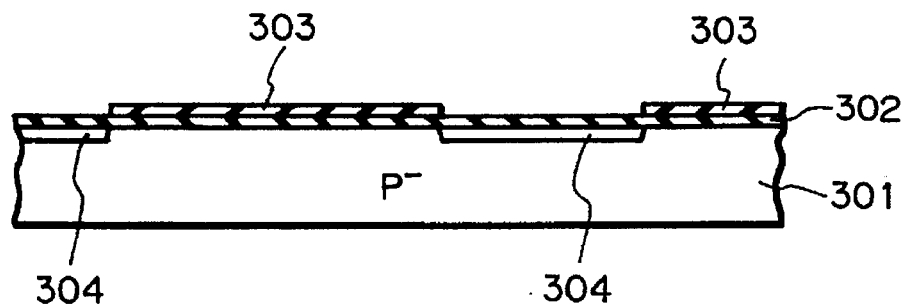
FIGS. 5A through 5F are cross-sectional views illustrating a third prior art method for manufacturing a contact structure.

First, referring to FIG. 5A, a silicon oxide layer 302 and a silicon nitride layer 303 are sequentially formed on a P⁻-type semiconductor substrate 301. Then, boron ions are implanted into the semiconductor substrate 301 with a mask of the silicon nitride layer 303 to form a P⁺-type impurity region 304.

Figure 5B:
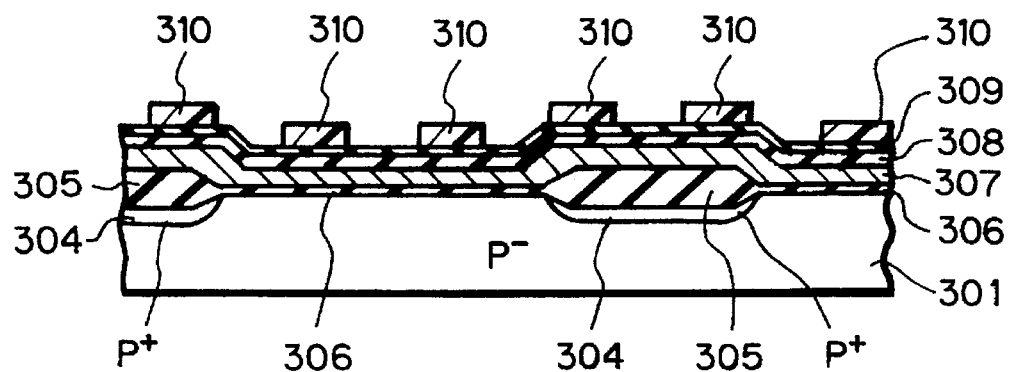

Next, referring to FIG. 5B, a field silicon oxide layer 305 is grown by thermally oxidizing the substrate 301 with a mask of the silicon nitride layer 303 using an LOCOS process. In this case, the P⁺-type impurity region 304 serves as a P-type channel stopper region. Then, the silicon nitride layer 303 and the silicon oxide layer 302 are removed. Then, a gate silicon oxide layer 306 is grown by thermally oxidizing the substrate 301. Then, a polycrystalline silicon layer 307, a silicon oxide layer 308 and an AlN$_x$ stopper layer 309 are sequentially formed. Then, a photoresist pattern 310 is formed thereon.

Figure 5C:
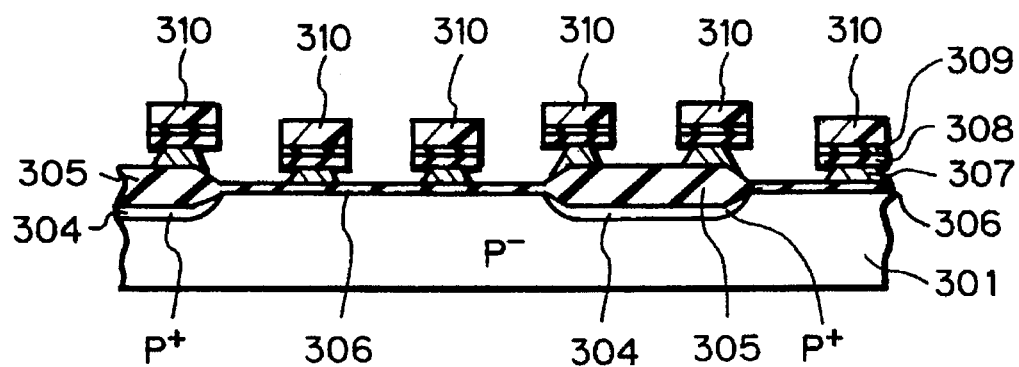

Next, referring to FIG. 5C, the AlN$_x$ stopper 308 is etched with a mask of the photoresist pattern 310, and thereafter, the silicon oxide layer 309 is etched with a mask of the photoresist pattern 310 and the AlN$_x$ stopper 309. Then, the polycrystalline silicic etched 307 is etched with a mask of the photoresist pattern 310, the AlN$_x$ stopper 309 and the silicon oxide layer 308. In this case, the polycrystalline silicon layer 307 is overetched as illustrated, so that the sidewalls of the polycrystalline silicon layer 307 are etched. Thus, the polycrystalline silicon layer 307 serves as a narrow word line. Then, the photoresist pattern 310 is removed.

Figure 5D:
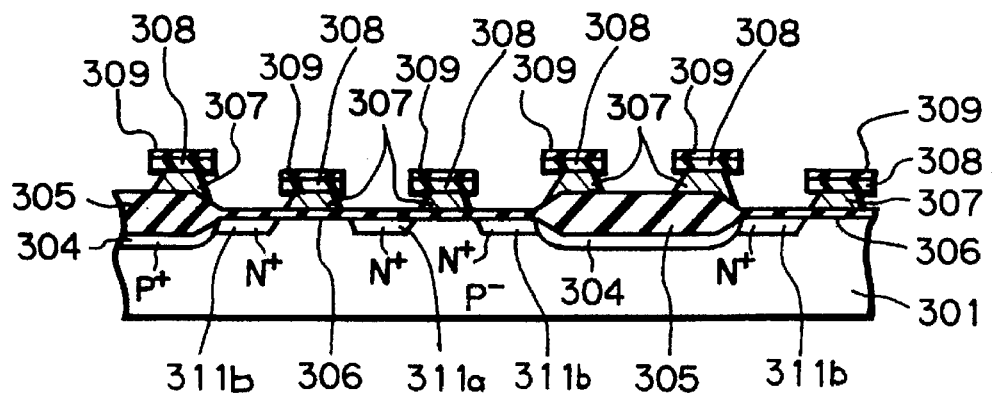

Next, referring to FIG. 5D, arsenic ions are implanted into the substrate 301 with a mask of the AlN$_x$ stopper 309, the silicon oxide layer 308 and the polycrystalline silicon layer 307, and an annealing operation is carried out, to thereby form N⁺-type impurity diffusion regions 311a and 311b. In this case, the N⁺-type impurity diffusion region 311a serves as a contact region for a bit line, and the N⁺-type impurity diffusion region 311b serves as a capacitor node.

Figure 5E:
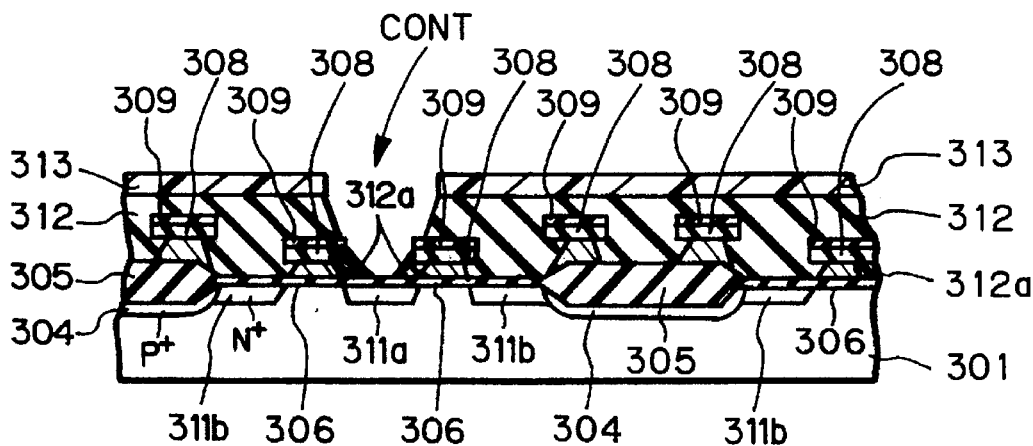

Next, referring to FIG. 5E, a silicon oxide layer 312 is formed on the entire surface, and a photoresist pattern 313 is formed thereon. Then, the silicon oxide layer 312 is etched with a mask of the photoresist pattern 313 by a reactive ion etching (RIE) process. In this case, the silicon oxide layer 312 is left as a sidewall layer 312a on sidewalls of the polycrystalline silicon layer 307.

In FIG. 5E, the contact hole CONT is formed in self-alignment with the AlN$_x$ stopper 309, even if the photoresist pattern 313 is shifted slightly from optimum location.

Figure 5F:
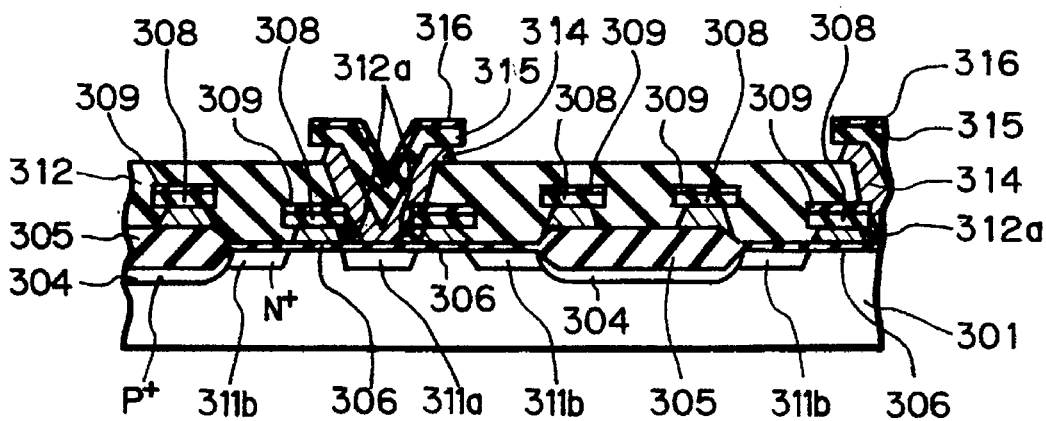

Finally, referring to FIG. 5F, a conductive layer 314 is deposited, and a silicon oxide layer 315 and an AlN$_x$ stopper 316 are sequentially deposited. Then, etching operations as carried out in FIG. 5D are carried out to form a bit line.

In the above-described third prior art method, however, since the silicon oxide layer 308 is present for avoiding thermal reaction between the AlN$_x$ stopper 309 and the polycrystalline silicon layer 307, the contact hole CONT is deeper by the height of the silicon oxide layer 308. This may cause a contact defect of the conductive layer 314 to the N⁺-type impurity diffusion region 311a. Also, as illustrated in FIG. 5C, since the polycrystalline silicon layer 307 is overetched to narrow the width of the upper portion of the polycrystalline silicon layer 307, the AlN$_x$ stopper 309 and the silicon oxide layer 308 may be unstable with the poly-crystalline silicon layer 307. At worst, the AlN$_x$ stopper 309 and the silicon oxide layer 308 are separated from the polycrystalline silicon layer 307, which also invites short-circuit between the polycrystalline silicon layer 307 and the conductive layer 314. Also, the resistance value of the polycrystalline silicon layer 307 becomes large due to the narrow width of the upper portion thereof.

FIGS. 6A through 6I are cross-sectional views illustrating a first embodiment of the method for manufacturing a contact structure according to the present invention.

Figure 6A:
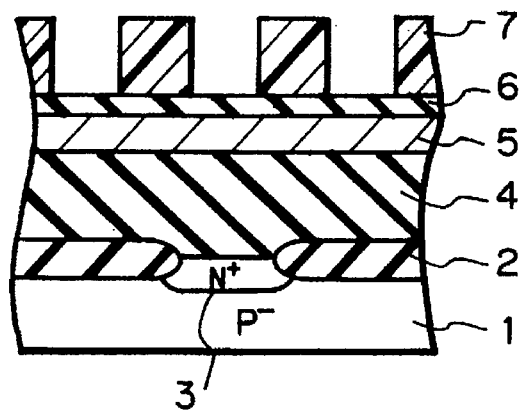
FIGS. 6A through 6I are cross-sectional views illustrating a first embodiment of the method for manufacturing a contact structure according to the present invention.

First, referring to FIG. 6A, a field silicon oxide layer 2 is grown by thermally oxidizing a P⁻-type monocrystalline silicon substrate 1 using a LOCOS process. Also, a gate silicon oxide layer and a gate electrode layer (not shown) are formed. Then, arsenic ions are implanted into the substrate 1 with a mask of the field silicon oxide layer 2, and an annealing operation at a temperature of about 900° C. for about 30 minutes is performed thereon, to form an N⁺-type impurity diffusion region 3.

Then, an about 0.1 μm thick non-doped silicon oxide layer is deposited on the entire surface by a CVD process, and thereafter, an about 0.3 μm thick BPSG layer is deposited thereon by a CVD process. Further, an about 0.05 μm thick non-doped silicon oxide layer is deposited thereon by a CVD process. Thus, an insulating layer 4 formed by a triple configuration of the non-doped silicon oxide layer, the BPSG layer and the non-doped silicon oxide layer is obtained.

Then, a contact hole (not shown) is perforated in the insulating layer 4.

Then, an about 0.2 μm thick phosphorus including polycrystalline silicon layer 5 is deposited by a low pressure CVD (LPVCD) process at a temperature of about 780° to 800° C. or by a plasma CVD process at a temperature of about 400° to 500° C. Also, an about 0.1 μm thick silicon nitride layer 6 is deposited on the polycrystalline silicon layer 5 by a CVD process. Then, a photoresist pattern 7 is formed on the silicon nitride layer 6.

Figure 6B:
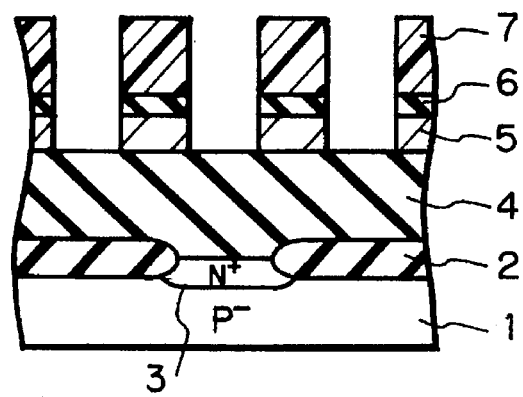

Next, referring to FIG. 6B, the silicon nitride layer 6 and the polycrystalline silicon layer 5 are anisotropically etched with a mask of the photoresist pattern 7 by a dry etching process where the etching rate of silicon nitride is about the same as that of polycrystalline silicon. As a result, the silicon nitride layer 6 and polycrystalline silicon layer 5 are etched perpendicularly. Then, the photoresist pattern 7 is removed.

Figure 6C:
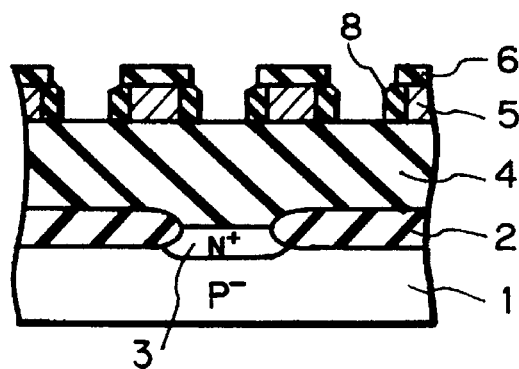

Next, referring to FIG. 6C, the polycrystalline silicon layer 5 is oxidized in a steam atmosphere at a temperature of about 950° C. for about 30 minutes. As a result, about 0.2 μm thick sidewall silicon oxide layers 8 are formed on sidewalls of the polycrystalline silicon layer 5. In this case, the thickness of the sidewall silicon oxide layers 8 inside of the silicon nitride layer 6 is about 0.1 μm, and also, the thickness of the sidewall silicon oxide layers 8 outside of the silicon nitride layer 6 is about 0.1 μm.

Figure 6D:
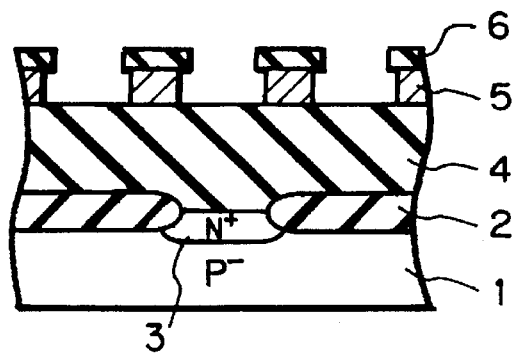

Next, referring to FIG. 6D, the sidewall silicon oxide layers 8 are etched by a wet etching process. As illustrated in FIG. 6D, the sidewall of the polycrystalline silicon layer 5 is approximately perpendicular. This makes a contact relationship between the silicon nitride layer 6 and the polycrystalline silicon layer 5 stable, so that the silicon nitride layer 6 is never separated from the polycrystalline silicon layer 5. Also, the resistance value of the polycrystalline silicon layer 5 is not reduced.

Figure 6E:
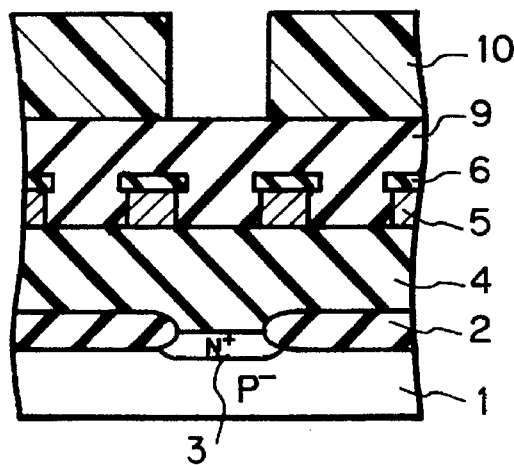

Next, referring to FIG. 6E, an about 0.1 μm thick silicon oxide layer and an about 0.3 μm thick BPSG layer are deposited on the entire surface by a CVD process. Then, a heating operation at a temperature of about 900° C. in a nitrogen atmosphere for about 30 minutes is performed upon the BPSG layer to reflow it. Thus, an insulating layer 9 formed by a double configuration of silicon oxide and BPSG is obtained. Then, a photoresist pattern 10 is formed.

Figure 6F:
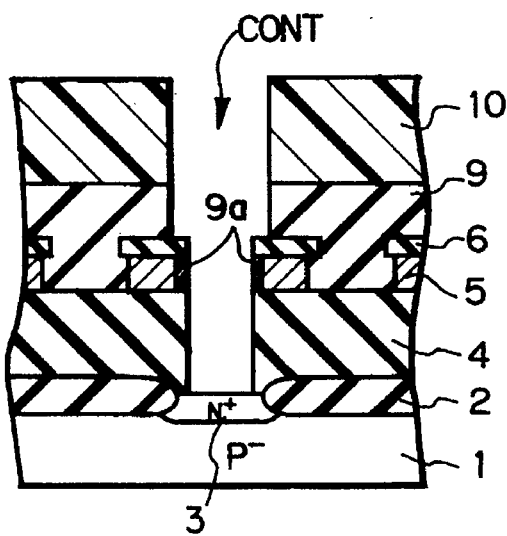

Next, referring to FIG. 6F, the insulating layers 9 and 4 are etched with a mask of the photoresist pattern 10 by a dry etching process using a mixture gas of $CF_4$ and $CH_2F_2$. In this dry etching process, the etching rate of silicon nitride is much smaller than that of silicon oxide. Therefore, the silicon nitride layer 6 serves as an etching stopper. As a result, the insulating layer 9 is left as sidewall layers 9a on sidewalls of the polycrystalline silicon layer 5. Thus, a contact hole CONT is formed.

Figure 6G:
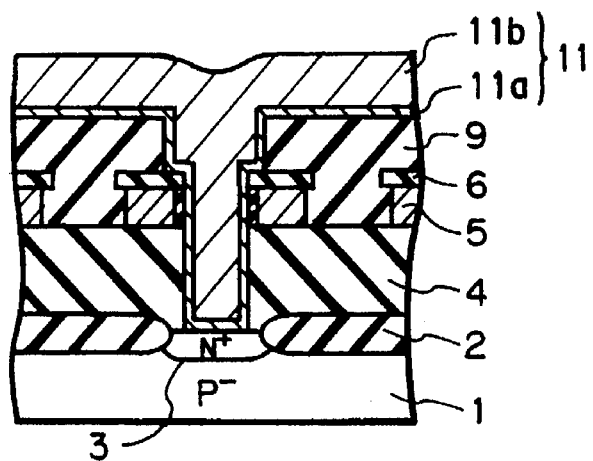

Next, referring to FIG. 6G, an about 0.1 μm thick contact barrier layer 11a made of titanium nitride is deposited on the entire surface. Then, an aluminum alloy layer 11b is deposited thereon and is buried in the contact hole CONT.

Figure 6H:
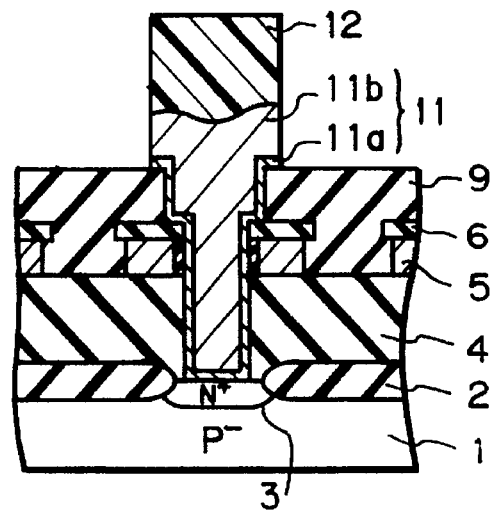

Next, referring to FIG. 6H, a photoresist pattern 12 is formed, and the aluminum alloy layer 11b and the contact barrier layer 11a are etched with a mask of the photoresist pattern 12.

Figure 6I:
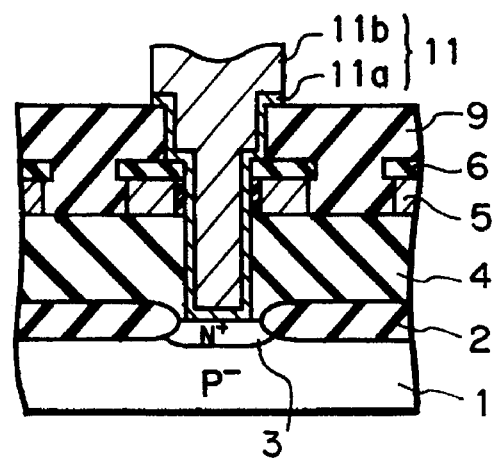

Finally, referring to FIG. 6I, the photoresist pattern 12 is removed. Thus, a connection layer 11 formed by the contact barrier layer 11a and the aluminum alloy layer 11b is obtained.

Thus, in the first embodiment, even when the radius of the contact hole CONT is smaller in a lower side than in an upper side, since the polycrystalline silicon layer 5 is covered by the silicon nitride layer 6 and the sidewall insulating layer 9a, no short-circuit occurs between the polycrystalline silicon layer 5 and the connection layer 11.

Also, in the first embodiment since the silicon nitride layer 6 as an etching stopper never thermally reacts with the polycrystalline silicon layer 5, so that the silicon nitride layer 6 is located directly on the polycrystalline silicon layer 5 without the silicon oxide layer 308 of the third prior art method, the depth of the contact hole CONT can be shallow, which can avoid a contact defect of the connection layer 11 and the $N^+$-type impurity diffusion region 3.

Further, in the first embodiment, since the etched polycrystalline silicon layer 5 has the same width along a perpendicular direction, the resistance value thereof can be reduced.

Still further, in the first embodiment, since the sidewall silicon oxide layer 8 is grown by the thermally oxidizing the polycrystalline silicon layer 5, the thickness of the sidewall silicon oxide layer 8 can be precisely controlled, i.e., a reduction of the polycrystalline silicon layer 5 with respect to the silicon nitride layer 6 can be precisely controlled. Further, since the sidewall silicon oxide layer 8 can be etched by a batch form type wet etching process, the throughput can be improved as compared with a leaf form type dry etching process.

Figure 7A:
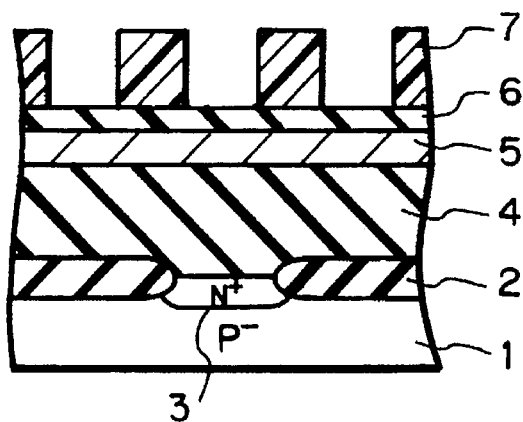
FIGS. 7A through 7H are cross-sectional views illustrating a second embodiment of the method for manufacturing a contact structure according to the present invention.
Figure 7B:
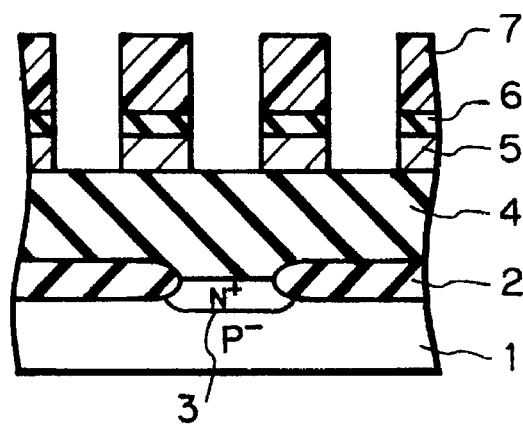
Figure 7C:
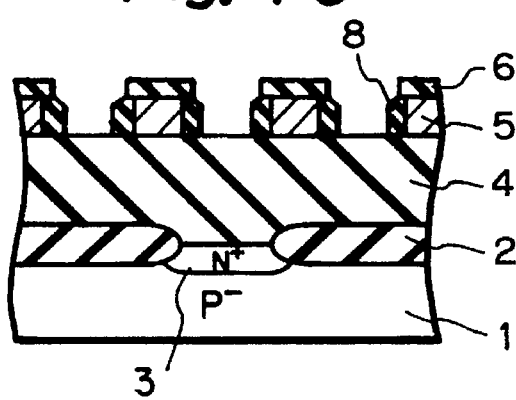

FIGS. 7A through 7H are cross-sectional views illustrating a second embodiment of the method for manufacturing a contact structure according to the present invention, Note that FIGS. 7A, 7B and 7C are the same as FIGS. 6A, 6B and 6C, respectively, and FIGS. 7D, 7E, 7F, 7G and 7H correspond to FIGS. 6E, 6F, 6G, 6H and 6I, respectively.

Figure 7D:
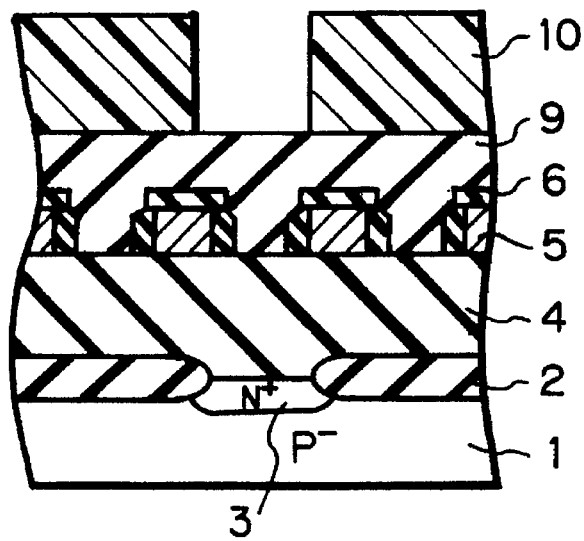
Figure 7E:
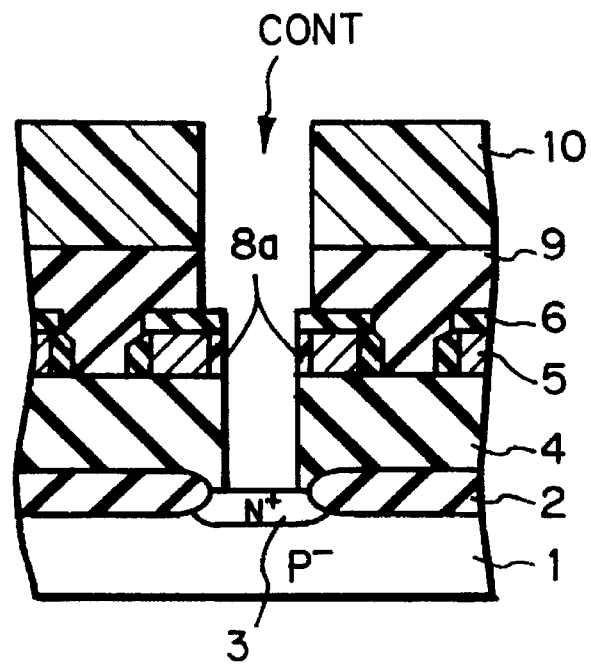
Figure 7F:
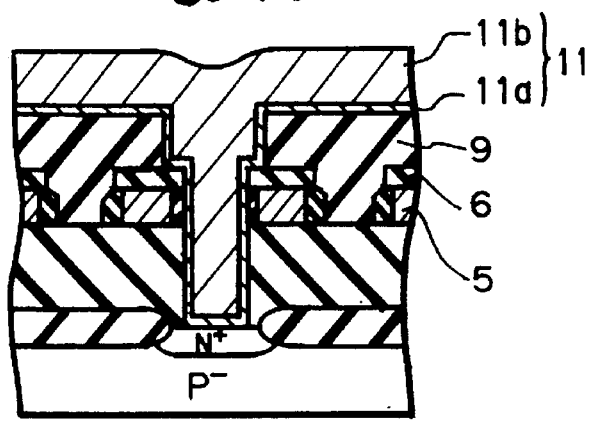
Figure 7G:
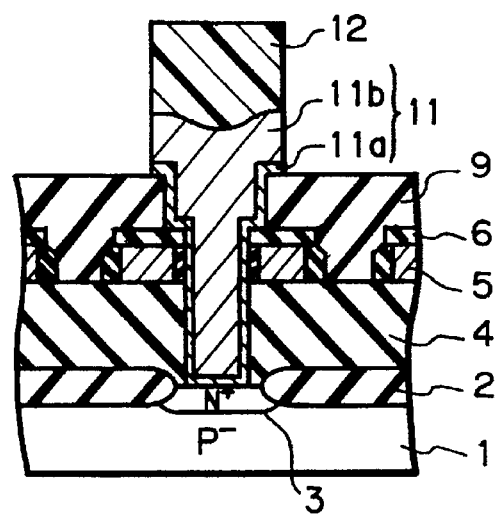
Figure 7H:
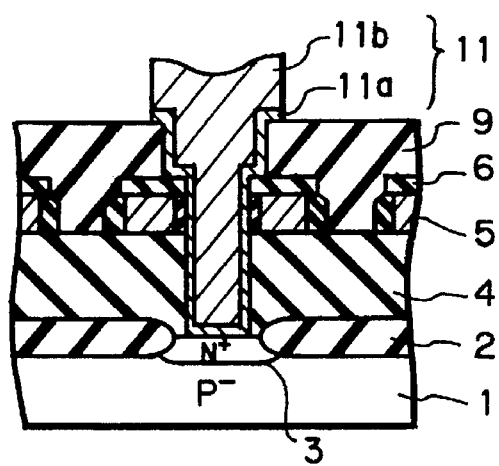

As illustrated in FIG. 7D, the insulating layer 9 is formed without removing the sidewall silicon oxide layer 8. As a result, as illustrated in FIG. 7E, when the contact hole CONT is formed, the sidewall silicon oxide layers 8 are left as sidewall layers 8a on sidewalls of the polycrystalline silicon layer 5. Thereafter, the manufacturing steps as illustrated in FIGS. 7F, 7G and 7H are carried out in the same way as in FIGS. 6G, 6H and 6I of the first embodiment.

Thus, in the second embodiment, since an etching step for etching the sidewall silicon oxide layer 8 is unnecessary, the number of manufacturing steps is reduced 30 as compared with the first embodiment, to thereby reduce the manufacturing cost.

FIGS. 8A through 8H are cross-sectional views illustrating a third embodiment of the method for manufacturing a contact structure according to the present invention. Note that FIGS. 8A, 8B, 8C, 8D, 8E, 8F, 8G and 8H correspond to FIG. 6A, 6B, 6D, 6E, 6F, 6G, 6H and 6I, respectively.

Figure 8A:
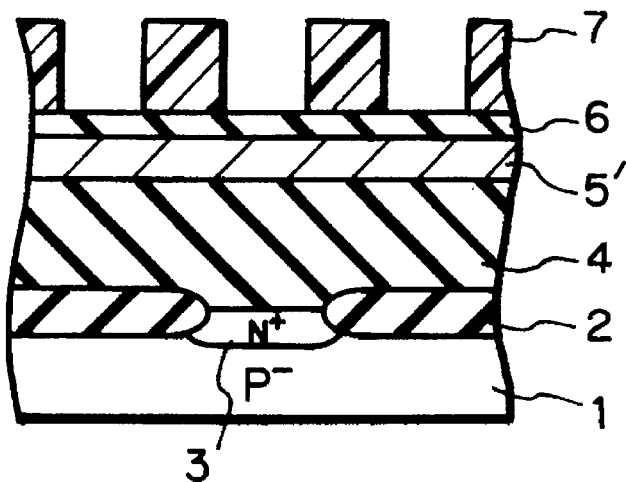
FIGS. 8A through 8H are cross-sectional views illustrating a third embodiment of the method for manufacturing a contact structure according to the present invention.

First, referring to FIG. 8A, a field silicon oxide layer 2 is grown by thermally oxidizing a $P^-$-type monocrystalline silicon substrate 1 using a LOCOS process. Also, a gate silicon oxide layer and a gate electrode layer (not shown) are formed. Then, arsenic ions are implanted into the substrate 1 with a mask of the field silicon oxide layer 2, and an annealing operation at a temperature of about 900° C. for about 30 minutes is performed thereon, to form an $N^+$-type impurity diffusion region 3.

Then, an about 0.1 μm thick non-doped silicon oxide layer is deposited on the entire surface by a CVD process, and thereafter, an about 0.3 μm thick BPSG layer is deposited thereon by a CVD process. Further, an about 0.05 μm thick non-doped silicon oxide layer is deposited thereon by a CVD process. Thus, an insulating layer 4 formed by a triple configuration of the non-doped silicon oxide layer, the BPSG layer and the non-doped silicon oxide layer is obtained.

Then, a contact hole (not shown) is perforated in the insulating layer 4.

Then, an about 0.1 μm thick tungsten silicide layer 5' is deposited by a sputtering process. Also, an about 0.1 μm thick silicon nitride layer 6 is deposited on the tungsten silicide layer 5' by a CVD process. Then, a photoresist pattern 7 is formed on the silicon nitride layer 6.

Figure 8B:
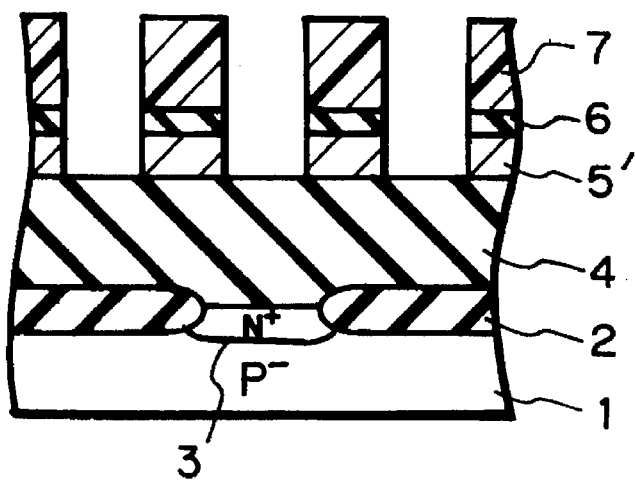

Next, referring to FIG. 8B, the silicon nitride layer 6 and the tungsten silicide layer 5' are anistopically etched with a mask of the photoresist pattern 7 by an anisotropic dry etching process where the etching rate of silicon nitride is about the same as that of tungsten silicide. As a result, the silicon nitride layer 6 and the tungsten silicide layer 5' are etched perpendicularly. Then, the photoresist pattern 7 is removed.

Figure 8C:
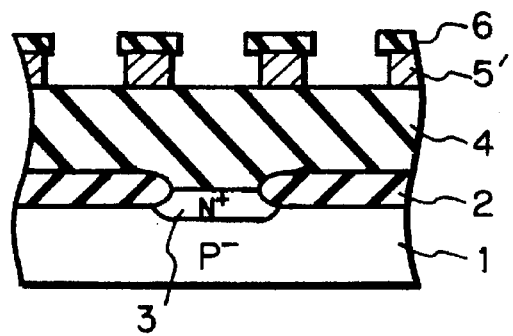
Figure 8D:
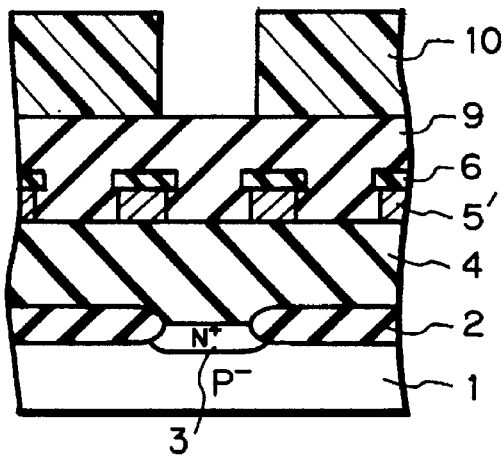
Figure 8E:
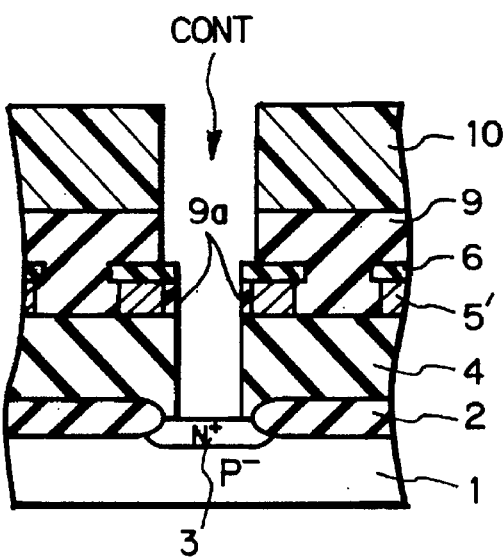
Figure 8F:
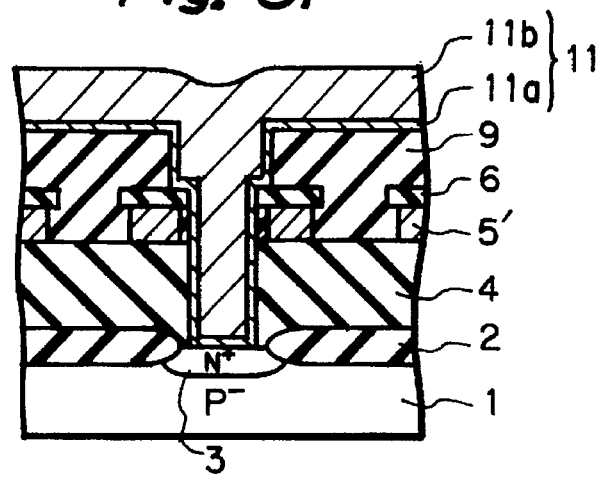
Figure 8G:
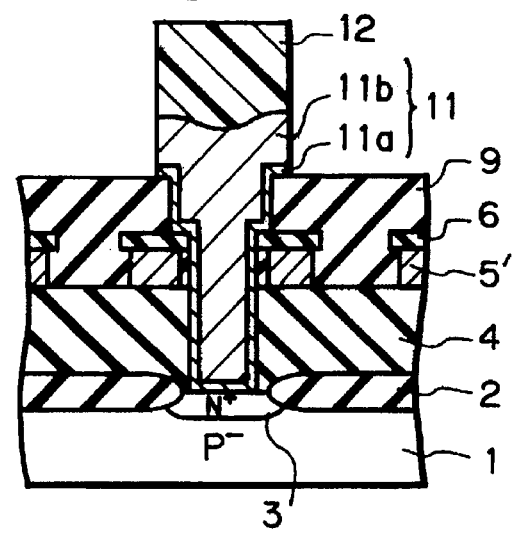
Figure 8H:
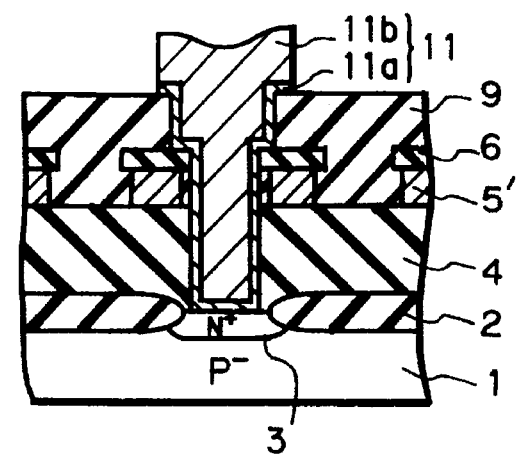

Next, referring to FIG. 8C, the tungsten silicide layer 5' is isotropically etched by a dry etching process using $SF_6$ gas. Note that this isotropical etching can be carried out by a wet etching process. As a result, a reduction of about 0.1 μm is generated in each side of the tungsten silicide layer 5'. Thereafter, the manufacturing steps as illustrated in FIGS. 8D through 8H are carried out in the same way as in FIGS. 6E through 6I of the first embodiment.

Thus, in the third embodiment, since an oxidizing operation upon the tungsten silicide layer 5' is unnecessary, the number of manufacturing steps is reduced as compared with the first embodiment, to thereby reduce the manufacturing cost.

In the above-described third embodiment, note that a refractory metal layer made of titanium or tungsten and a refractory metal nitride layer made of titanium nitride or tungsten nitride can be used instead of the tungsten silicide layer 5'.

As explained hereinbefore, according to the present invention, even when the radius of a contact hole is smaller in a lower side than in an upper side, since a first connection layer is covered by a silicon nitride layer and a sidewall insulating layer, a short-circuit between the first connection layer and a second connection layer buried in the contact hole can be avoided. Also, since the silicon nitride layer as an etching stopper never thermally reacts with the first connection layer, so that the silicon nitride layer is located directly on the first connection layer, the depth of the contact hole can be shallow, which can avoid a contact defect of the first connection layer.

I claim:

1. A method for manufacturing a contact structure, comprising the steps of:

forming a first insulating layer on a semiconductor substrate;

forming a first conductive layer on said first insulating layer;

forming a silicon nitride layer directly on said first conductive layer;

forming a first pattern layer on said silicon nitride layer;

anisotropically etching said silicon nitride layer and said first conductive layer with a mask of said first pattern layer where an etching rate of said silicon nitride layer by said anisotropical etching step is about the same as an etching rate of said first conductive layer by said anisotropical etching step, whereby edges of said silicon nitride layer and said first conductive layer are etched approximately perpendicularly;

removing said first pattern layer;

oxidizing said first conductive layer with a mask of said silicon nitride layer to form a sidewall insulating layer on a sidewall of said first conductive layer, after said first pattern layer is removed, said first conductive layer being oxidized without forming a spacer;

forming a second insulating layer on said first insulating layer, said silicon nitride layer and said sidewall insulating layer after said first conductive layer is oxidized;

forming a second pattern layer on said second insulating layer;

perforating a contact hole in said second insulating layer and said first insulating layer;

removing said second pattern layer; and burying a second conductive layer in said contact hole.

2. A method as set forth in claim 1, further comprising a step of removing said sidewall insulating layer after said sidewall insulating layer is formed.

3. A method as set forth in claim 1, wherein said first conductive layer is made of polycrystalline silicon.

4. A method as set forth in claim 1, wherein said second insulating layer is made of a triple structure of non-doped silicon oxide, boron-including phospho-silicated glass and non-doped silicon oxide.

5. A method as set forth in claim 4, further comprising a step of reflowing said second insulating layer.

* * * * *